(12) United States Patent
Sekine

(10) Patent No.: US 11,082,030 B2
(45) Date of Patent: Aug. 3, 2021

(54) HIGH-PASS FILTER AND MULTIPLEXER

(71) Applicant: TAIYO YUDEN CO., LTD., Tokyo (JP)

(72) Inventor: Hideyuki Sekine, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/520,034

(22) Filed: Jul. 23, 2019

(65) Prior Publication Data
US 2020/0144990 A1    May 7, 2020

(30) Foreign Application Priority Data

Nov. 6, 2018   (JP) .............................. JP2018-208626

(51) Int. Cl.
| | |
|---|---|
| *H03H 9/54* | (2006.01) |
| *H03H 9/64* | (2006.01) |
| *H03H 9/72* | (2006.01) |
| *H03H 9/70* | (2006.01) |
| *H03H 9/205* | (2006.01) |
| *H03H 9/58* | (2006.01) |

(52) U.S. Cl.
CPC ............ *H03H 9/542* (2013.01); *H03H 9/205* (2013.01); *H03H 9/582* (2013.01); *H03H 9/64* (2013.01); *H03H 9/70* (2013.01); *H03H 9/72* (2013.01)

(58) Field of Classification Search
CPC ............... H03H 9/54; H03H 9/64; H03H 9/72
See application file for complete search history.

(56) References Cited

U.S. PATENT DOCUMENTS

| | | | |
|---|---|---|---|
| 6,377,140 B1 | 4/2002 | Ehara et al. | ................... 333/193 |
| 9,065,419 B2* | 6/2015 | Hara | ..................... H03H 9/6483 |
| 2011/0227807 A1* | 9/2011 | Iwaki | .................... H03H 9/0576 |
| | | | 343/850 |
| 2013/0127566 A1* | 5/2013 | Iwaki | .................... H03H 9/6436 |
| | | | 333/133 |
| 2017/0179930 A1* | 6/2017 | Tsukamoto | ............ H03H 9/542 |
| 2017/0264270 A1* | 9/2017 | Ishikawa | ............... H03H 9/6409 |
| 2018/0226952 A1* | 8/2018 | Tanaka | ..................... H05K 1/16 |
| 2019/0363696 A1* | 11/2019 | Komatsu | ................... H03H 9/25 |

FOREIGN PATENT DOCUMENTS

| | | |
|---|---|---|
| JP | 7-221504 A | 8/1995 |
| JP | 2001-24475 A | 1/2001 |
| JP | 2018-129680 A | 8/2018 |
| JP | 2018-129683 A | 8/2018 |

\* cited by examiner

*Primary Examiner* — Dean O Takaoka
(74) *Attorney, Agent, or Firm* — Stein IP, LLC

(57) ABSTRACT

A high-pass filter includes: at least one capacitor located in a first pathway between input and output terminals and connected between the input and output terminals; at least one inductor, a first end of the at least one inductor being coupled to the first pathway, a second end of the at least one inductor being coupled to a ground; at least one first acoustic wave resonator located in a second pathway connected in parallel to the first pathway between the input and output terminals, the at least one first acoustic wave resonator being connected in parallel to the at least one capacitor; and at least one second acoustic wave resonator, a first end of the at least one second acoustic wave resonator being coupled to the second pathway, a second end of the at least one second acoustic wave resonator being coupled to a ground.

11 Claims, 11 Drawing Sheets

HIGH-PASS FILTER AND MULTIPLEXER

CROSS-REFERENCE TO RELATED APPLICATION

This application is based upon and claims the benefit of priority of the prior Japanese Patent Application No. 2018-208626, filed on Nov. 6, 2018, the entire contents of which are incorporated herein by reference.

FIELD

A certain aspect of the present invention relates to a high-pass filter and a multiplexer.

BACKGROUND

There has been known a high-pass filter in which an acoustic wave resonator is provided to an LC circuit formed of a capacitor and an inductor, as disclosed in, for example, Japanese Patent Application Publication Nos. 2018-129680 and 2018-129683 (hereinafter, referred to as Patent Documents 1 and 2, respectively).

SUMMARY

According to a first aspect of the present invention, there is provided a high-pass filter including: at least one capacitor located in a first pathway between an input terminal and an output terminal, the at least one capacitor being connected between the input terminal and the output terminal; at least one inductor, a first end of the at least one inductor being coupled to the first pathway, a second end of the at least one inductor being coupled to a ground; at least one first acoustic wave resonator located in a second pathway connected in parallel to the first pathway between the input terminal and the output terminal, the at least one first acoustic wave resonator being connected in parallel to the at least one capacitor; and at least one second acoustic wave resonator, a first end of the at least one second acoustic wave resonator being coupled to the second pathway, a second end of the at least one second acoustic wave resonator being coupled to a ground.

According to a second aspect of the present invention, there is provided a multiplexer including the above high-pass filter.

DETAILED DESCRIPTION

In the high-pass filters disclosed in Patent Documents 1 and 2, the steepness of the attenuation in a transition region between the passband and the stopband is insufficient.

Figure 1A:
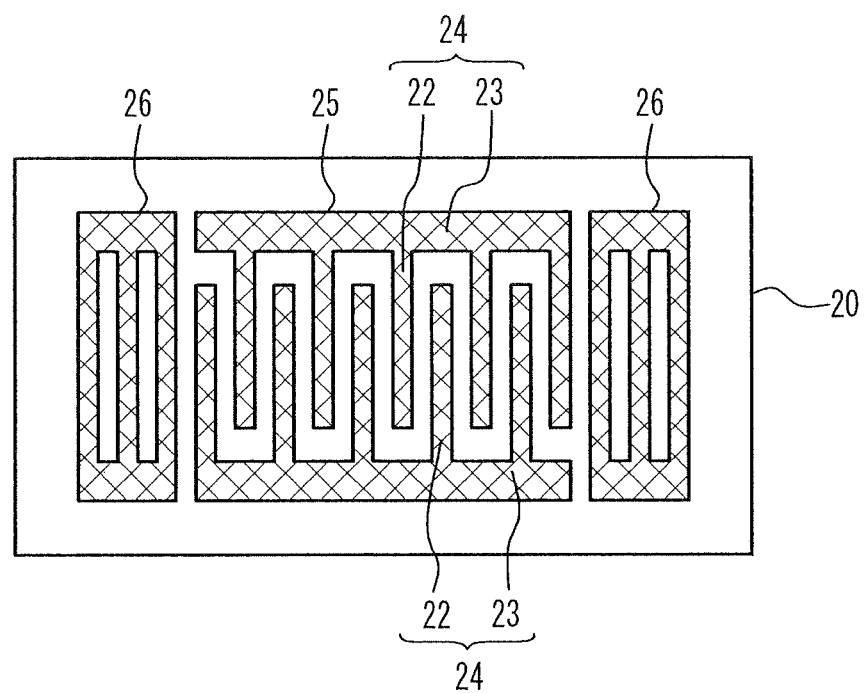
FIG. 1A is a plan view of a surface acoustic wave resonator used in comparative examples and embodiments.

An acoustic wave resonator used in comparative examples and embodiments are described, first. FIG. 1A is a plan view of a surface acoustic wave resonator used in the comparative examples and the embodiments. As illustrated in FIG. 1A, an interdigital transducer (IDT) 25 and reflectors 26 are located on the upper surface of a piezoelectric substrate 20. The IDT 25 includes a pair of comb-shaped electrodes 24 facing each other. The comb-shaped electrode 24 includes a plurality of electrode fingers 22 and a bus bar 23 connecting the electrode fingers 22. The reflectors 26 are located at both sides of the IDT 25 in a direction in which the electrode fingers 22 are arranged. The IDT 25 excites a surface acoustic wave on the piezoelectric substrate 20. The surface acoustic wave resonator is configured as a one-port resonator. The piezoelectric substrate 20 is, for example, a lithium tantalate substrate, a lithium niobate substrate, or a crystal substrate. The piezoelectric substrate 20 may be bonded on a support substrate such as, but not limited to, a sapphire substrate, a spinel substrate, an alumina substrate, a crystal substrate, or a silicon substrate. Furthermore, an insulator layer made of silicon oxide, aluminum nitride, or the like may be located between the piezoelectric substrate 20 and the support substrate. The IDT 25 and the reflectors 26 are formed of, for example, an aluminum film, a copper film, or a molybdenum film. A protective film or a temperature compensation film may be located on the piezoelectric substrate 20 so as to cover the IDT 25 and the reflectors 26.

Figure 1B:
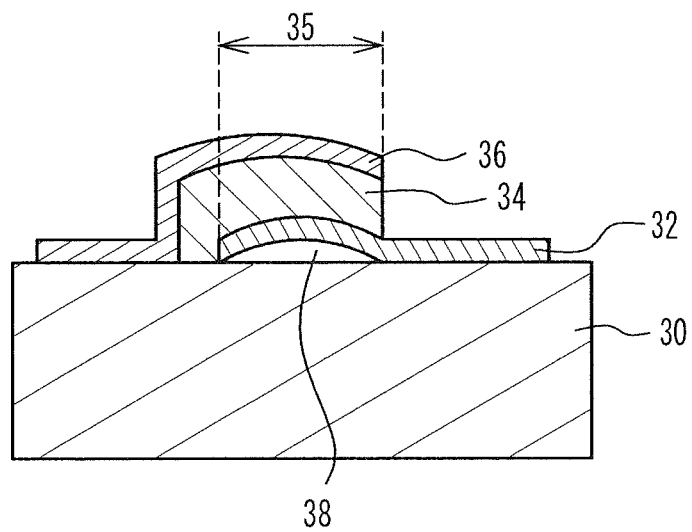
FIG. 1B is a cross-sectional view of a piezoelectric thin film resonator used in the comparative examples and the embodiments.

FIG. 1B is across-sectional view of a piezoelectric thin film resonator used in the comparative examples and the embodiments. As illustrated in FIG. 1B, a piezoelectric film 34 is located on a substrate 30. A lower electrode 32 and an upper electrode 36 are located so as to sandwich the piezoelectric film 34. An air gap 38 is formed between the lower electrode 32 and the substrate 30. The region where the lower electrode 32 and the upper electrode 36 face each other across at least a part of the piezoelectric film 34 is a resonance region 35. The lower electrode 32 and the upper electrode 36 in the resonance region 35 excites an acoustic wave in the thickness extension mode in the piezoelectric film 34. The piezoelectric thin film resonator is configured as a one-port resonator. The substrate 30 is, for example, a sapphire substrate, a spinel substrate, an alumina substrate, a glass substrate, a crystal substrate, or a silicon substrate. The lower electrode 32 and the upper electrode 36 are formed of a metal film such as, but not limited to, a ruthenium film. The piezoelectric film 34 is, for example, an aluminum nitride film. An acoustic mirror reflecting the acoustic wave may be provided instead of the air gap 38.

FIRST COMPARATIVE EXAMPLE

Figure 2A:
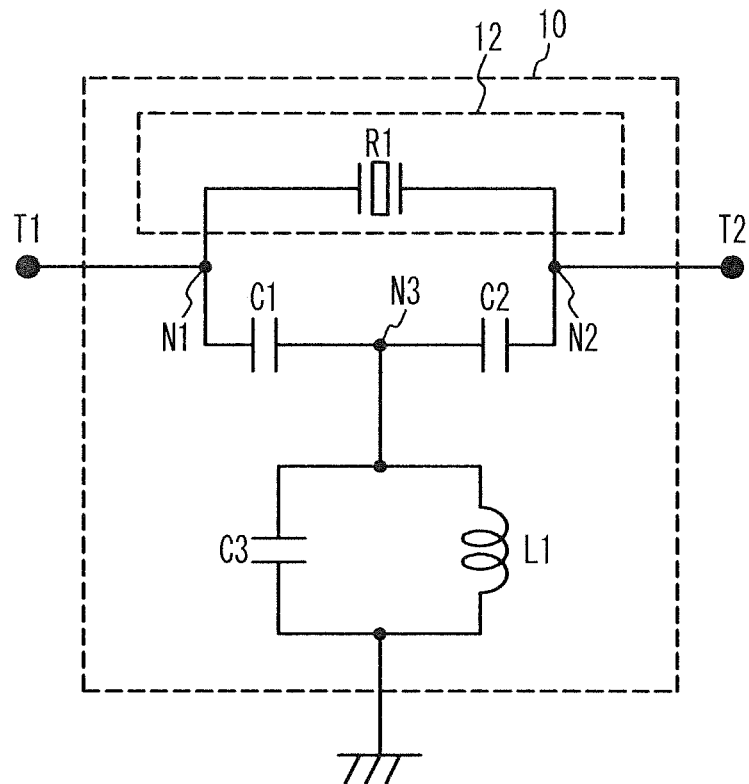
FIG. 2A is a circuit diagram of a high-pass filter in accordance with a first comparative example.

FIG. 2A is a circuit diagram of a high-pass filter in accordance with a first comparative example. As illustrated in FIG. 2A, a high-pass filter (HPF) 10 includes capacitors C1 through C3, an inductor L1, and an acoustic wave resonator R1. The capacitors C1 and C2 are connected in series between terminals T1 and T2. A first end of the inductor L1 is coupled to a node N3 between the capacitors C1 and C2, and a second end of the inductor L1 is coupled to a ground. The capacitor C3 is connected in parallel to the inductor L1. The acoustic wave resonator R1 is connected in parallel to the capacitors C1 and C2 between a node N1 and a node N2. An acoustic wave resonator circuit 12 includes the acoustic wave resonator R1.

The transmission characteristic between the terminals T1 and T2 of the HPF 10 in the first comparative example was simulated. The simulation conditions are as follows.

Figure 2B:
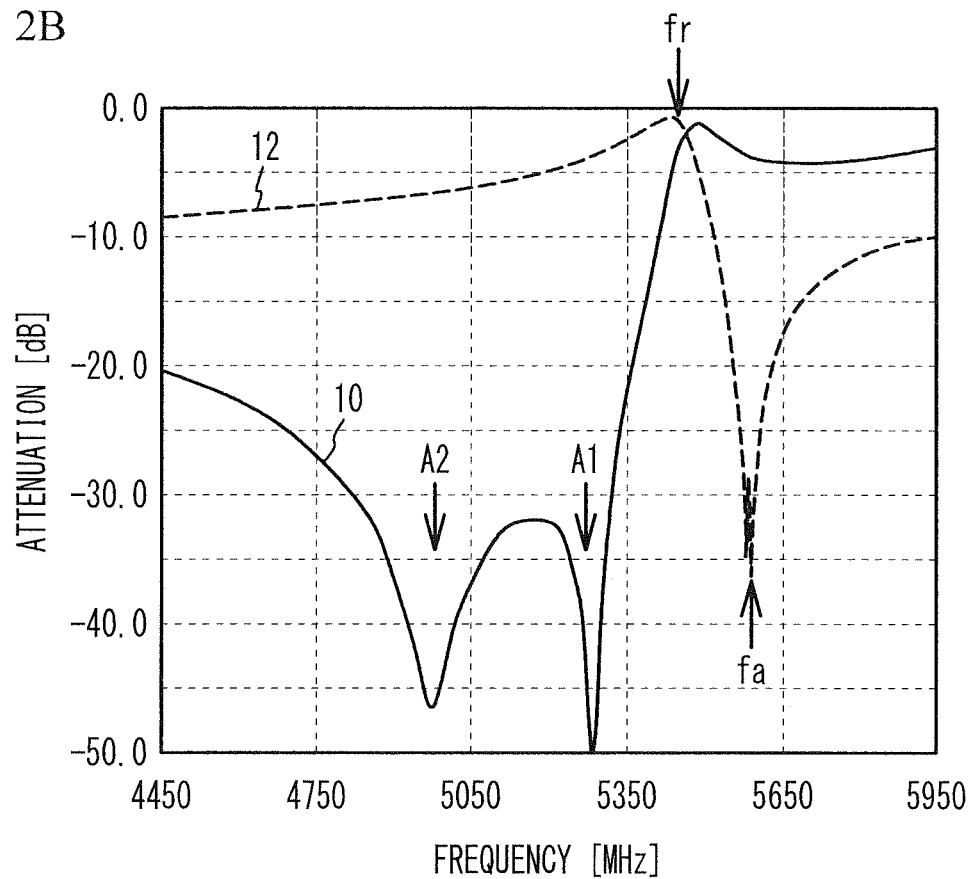
FIG. 2B illustrates the transmission characteristics of the high-pass filter of the first comparative example.

Capacitances of the capacitors C1 through C3
C1: 0.23 pF
C2: 0.23 pF
C3: 0.21 pF
Inductance of the inductor L1
L1: 1.05 nH
Structure of the acoustic wave resonator R1: Piezoelectric thin film resonator illustrated in FIG. 1B
Substrate 30: Silicon substrate
Lower electrode 32: Ruthenium film with a thickness of 60 nm
Piezoelectric film 34: Aluminum nitride film with a thickness of 400 nm
Upper electrode 36: Ruthenium film with a thickness of 60 nm
Characteristics of the acoustic wave resonator R1
Resonant frequency fr: 5431 MHz
Antiresonant frequency fa: 5585 MHz FIG. 2B illustrates the transmission characteristics of the high-pass filter in accordance with the first comparative example. The passbands of the HPF 10 and the acoustic wave resonator circuit 12 are illustrated. As illustrated in FIG. 2B, the resonant frequency fr of the acoustic wave resonator R1 is located near the low-frequency end of the passband of the HPF 10. The antiresonant frequency fa of the acoustic wave resonator R1 is located within the passband of the HPF 10, but no spurious occurs within the passband. Attenuation poles A1 (5287 MHz) and A2 (4977 MHz) are formed at frequencies lower than the passband.

The frequency at which the attenuation of the HPF 10 is −10 dB is 5413 MHz, the frequency at which the attenuation of the HPF 10 is −30 dB is 5323 MHz, and the difference between them is approximately 90 MHz. The difference between the frequency at which the attenuation is −10 dB and the frequency at which the attenuation is −30 dB is defined as a transition width. In the first comparative example, the transition width is 90 MHz.

Figure 3A:
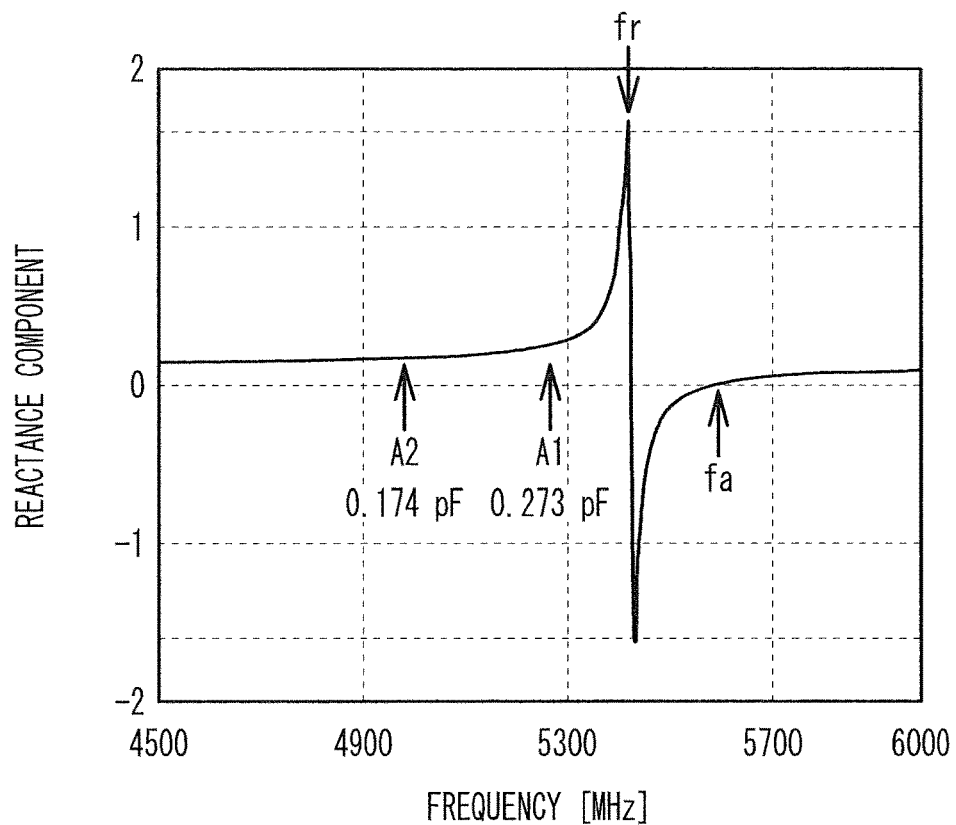
FIG. 3A illustrates the frequency characteristic of the reactance component of the acoustic wave resonator in the first comparative example.

The attenuation poles A1 and A2 in the first comparative example were examined. FIG. 3A illustrates the frequency characteristic of the reactance component of the acoustic wave resonator in the first comparative example. When the reactance component is positive, the acoustic wave resonator is capacitive, and when the reactance component is negative, the acoustic wave resonator is inductive. As illustrated in FIG. 3A, the reactance component of the acoustic wave resonator R1 depends on frequency. The reactance component is negative between the resonant frequency and the antiresonant frequency. At other frequencies, the reactance component is positive, and the acoustic wave resonator R1 can be equivalently regarded as a capacitor. The capacitance of the acoustic wave resonator R1 at the attenuation pole A1 is 0.273 pF, and the capacitance of the acoustic wave resonator R1 at the attenuation pole A2 is 0.174 pF.

Figure 3B:
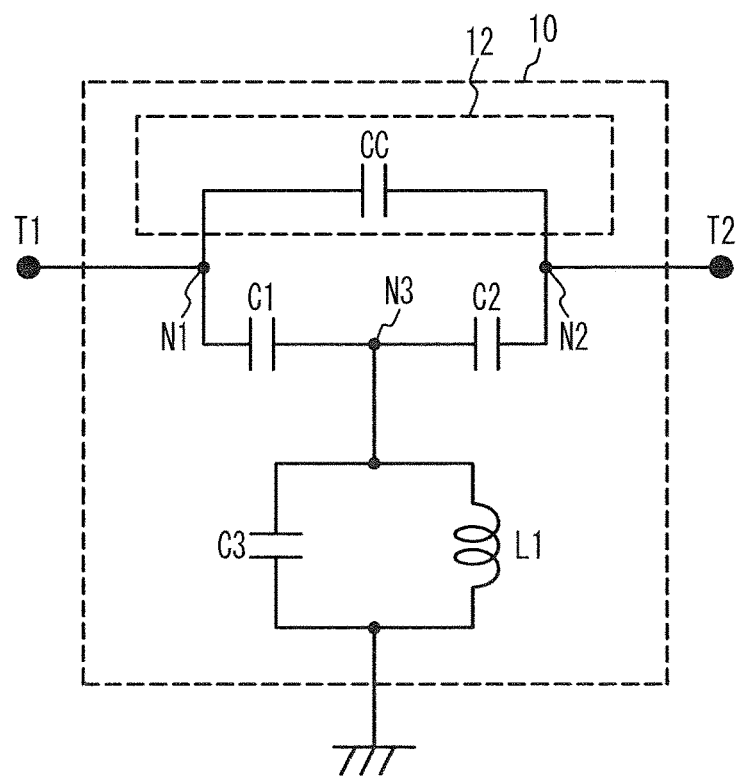
FIG. 3B illustrates an equivalent circuit in which the acoustic wave resonator of the high-pass filter in the first comparative example is equivalently substituted by a capacitor.

FIG. 3B illustrates an equivalent circuit in which the acoustic wave resonator of the high-pass filter in the first comparative example is equivalently substituted by a capacitor. As illustrated in FIG. 3B, the acoustic wave resonator R1 was equivalently substituted by a capacitor CC. The transmission characteristic of the HPF 10 was simulated under the assumption that the equivalent capacitor CC had a capacitance of 0.273 pF, which is the capacitance of the acoustic wave resonator R1 at the attenuation pole A1. In addition, the transmission characteristic of the HPF 10 was simulated under the assumption that the capacitor CC had a capacitance of 0.174 pF, which is the capacitance of the acoustic wave resonator R1 at the attenuation pole A2.

Figure 4A:
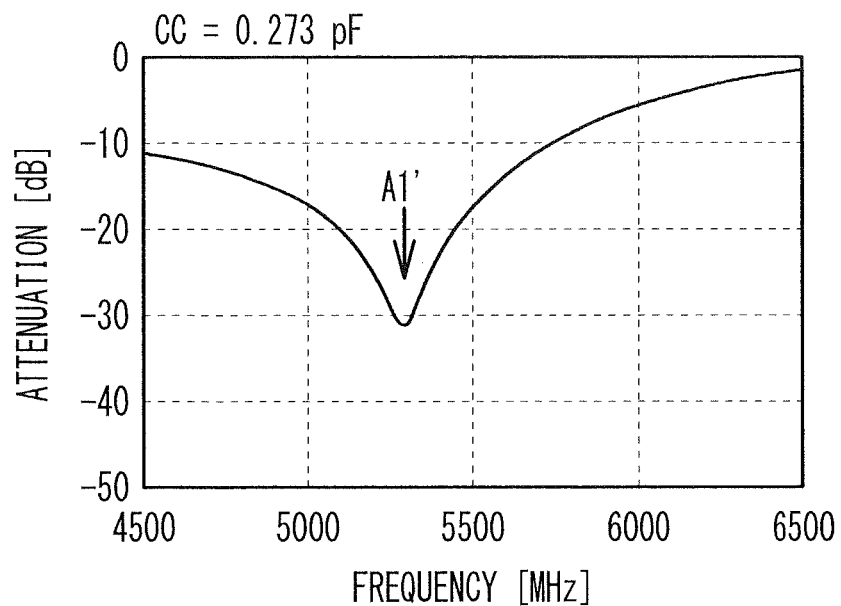
FIG. 4A illustrates a transmission characteristic when the equivalent capacitor in the first comparative example has a capacitance of 0.273 pF.
Figure 4B:
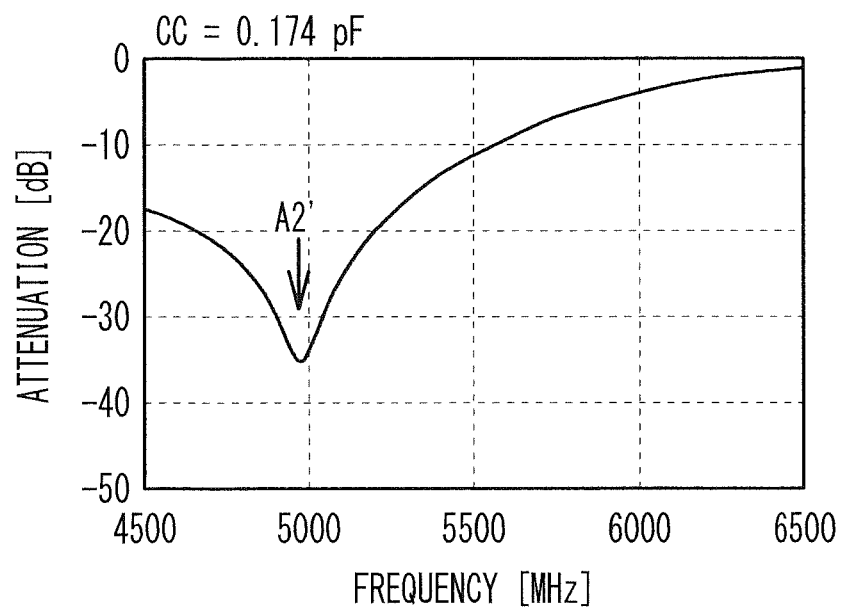
FIG. 4B illustrates a transmission characteristic when the equivalent capacitor in the first comparative example has a capacitance of 0.174 pF.

FIG. 4A illustrates the transmission characteristic under the assumption that the equivalent capacitor has a capacitance of 0.273 pF in the first comparative example, and FIG. 4B illustrates the transmission characteristic under the assumption the equivalent capacitor has a capacitance of 0.174 pF in the first comparative example. As illustrated in FIG. 4A, when the capacitance of the capacitor CC is 0.273 pF, an attenuation pole A1' is formed at 5284 MHz. This frequency is substantially identical to 5287 MHz of the attenuation pole A1. As illustrated in FIG. 4B, when the capacitance of the capacitor CC is 0.174 pF, the attenuation pole A2' is formed at 4971 MHz. This frequency is substantially identical to 4977 MHz of the attenuation pole A2.

As described above, it is considered that the attenuation poles A1 and A2 of the first comparative example are attenuation poles associated with the acoustic wave resonator R1, and are attenuation poles formed by the capacitors C1 through C3, the inductor L1, and the acoustic wave resonator R1.

In the first comparative example, no spurious occurs in the passband, but the transition width is as wide as 90 MHz.

SECOND COMPARATIVE EXAMPLE

Figure 5A:
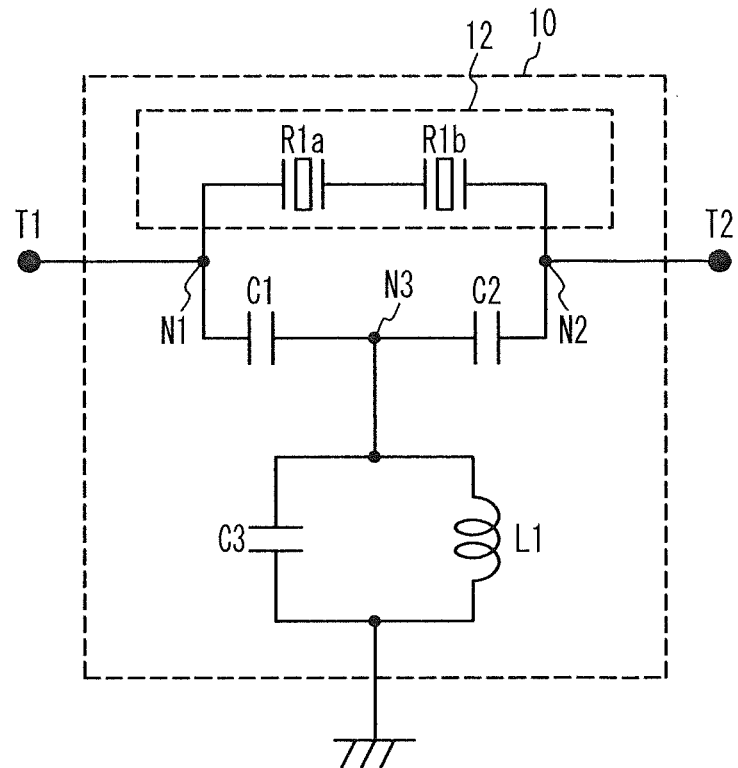
FIG. 5A is a circuit diagram of a high-pass filter in accordance with a second comparative example.

In a second comparative example, two acoustic wave resonators R1 are connected in series, and the resonant frequencies of the acoustic wave resonators R1 are made to be different. FIG. 5A is a circuit diagram of a high-pass filter in accordance with the second comparative example. As illustrated in FIG. 5A, in the second comparative example, the acoustic wave resonator R1 of the first comparative example is divided in series into acoustic wave resonators R1a and R1b. The acoustic wave resonator circuit 12 includes the acoustic wave resonators R1a and R1b.

The transmission characteristic between the terminals T1 and T2 of the HPF 10 of the second comparative example was simulated. The simulation conditions are as follows.

Characteristics of the acoustic wave resonator R1a
Resonant frequency fr1: 5395 MHz
Antiresonant frequency fa1: 5530 MHz
Characteristics of the acoustic wave resonator R1b
Resonant frequency fr2: 5455 MHz
Antiresonant frequency fa2: 5590 MHz Other simulation conditions are the same as the simulation conditions of the first comparative example.

Figure 5B:
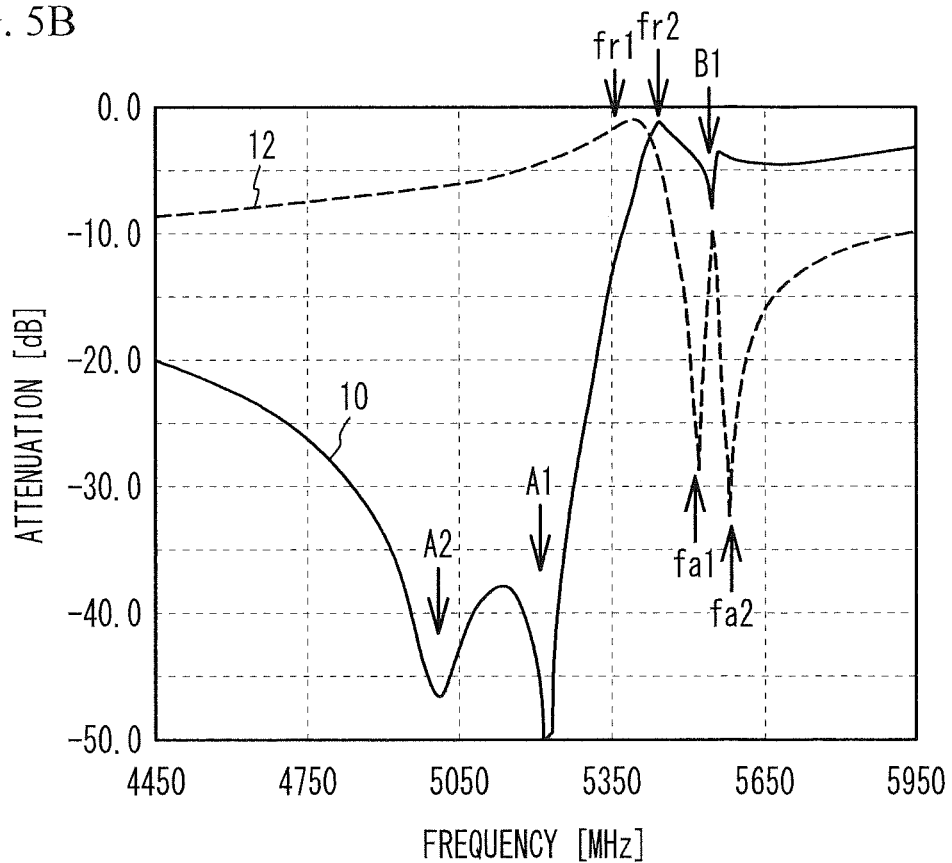
FIG. 5B illustrates the transmission characteristics of the high-pass filter of the second comparative example.

FIG. 5B illustrates the transmission characteristics of the high-pass filter of the second comparative example. The passbands of the HPF 10 and the acoustic wave resonator circuit 12 are illustrated. As illustrated in FIG. 5B, spurious B1 of which the frequency is 5557 MHz is formed within the passband. It is considered that the spurious B1 is due to the antiresonant frequencies fa1 and fa2 of the two acoustic wave resonators R1a and R1b. The attenuation poles A1 (5228 MHz) and A2 (5017 MHz) are formed at frequencies lower than the passband.

The frequency at which the attenuation of the HPF 10 is −10 dB is 5380 MHz, the frequency at which the attenuation of the HPF 10 is −30 dB is 5281 MHz, and the difference between them is approximately 99 MHz. In the second comparative example, the spurious B1 is formed within the passband, and the transition width is wider than that in the first comparative example.

THIRD COMPARATIVE EXAMPLE

Figure 6A:
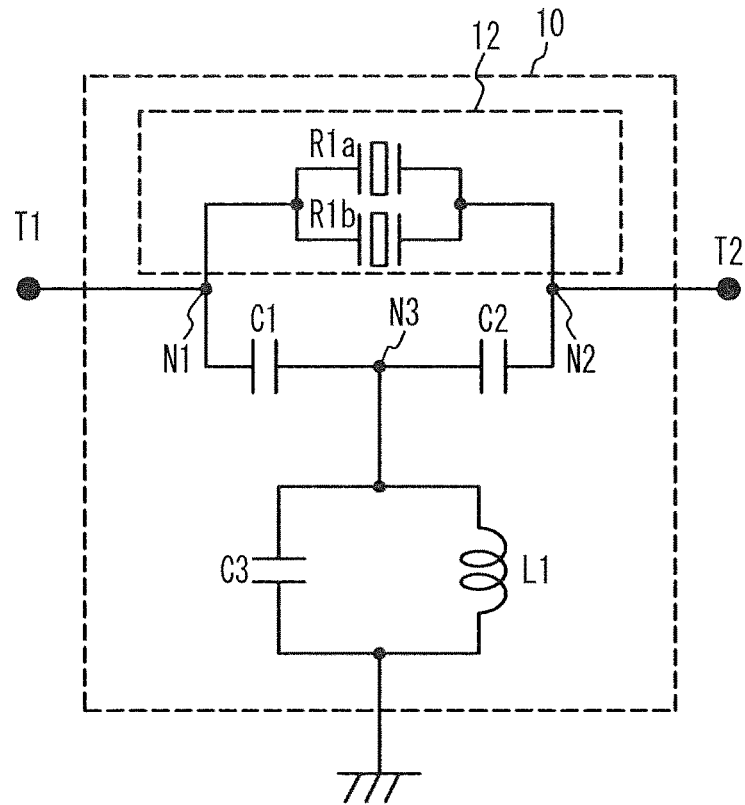
FIG. 6A is a circuit diagram of a high-pass filter in accordance with a third comparative example.

In a third comparative example, two acoustic wave resonators R1 are connected in parallel, and the resonant frequencies of the acoustic wave resonators R1 are made to be different. FIG. 6A is a circuit diagram of a high-pass filter in accordance with the third comparative example. As illustrated in FIG. 6A, in the third comparative example, the acoustic wave resonator R1 of the first comparative example is divided in parallel into the acoustic wave resonators R1a and R1b. The acoustic wave resonator circuit 12 includes the acoustic wave resonators R1a and R1b.

The transmission characteristic between the terminals T1 and T2 of the HPF 10 of the third comparative example was simulated. The simulation conditions are as follows.

Characteristics of the acoustic wave resonator R1a
Resonant frequency fr1: 5317 MHz
Antiresonant frequency fa1: 5360 MHz
Characteristics of the acoustic wave resonator R1b
Resonant frequency fr2: 5430 MHz
Antiresonant frequency fa2: 5552 MHz Other simulation conditions are the same as the simulation conditions of the first comparative example.

Figure 6B:
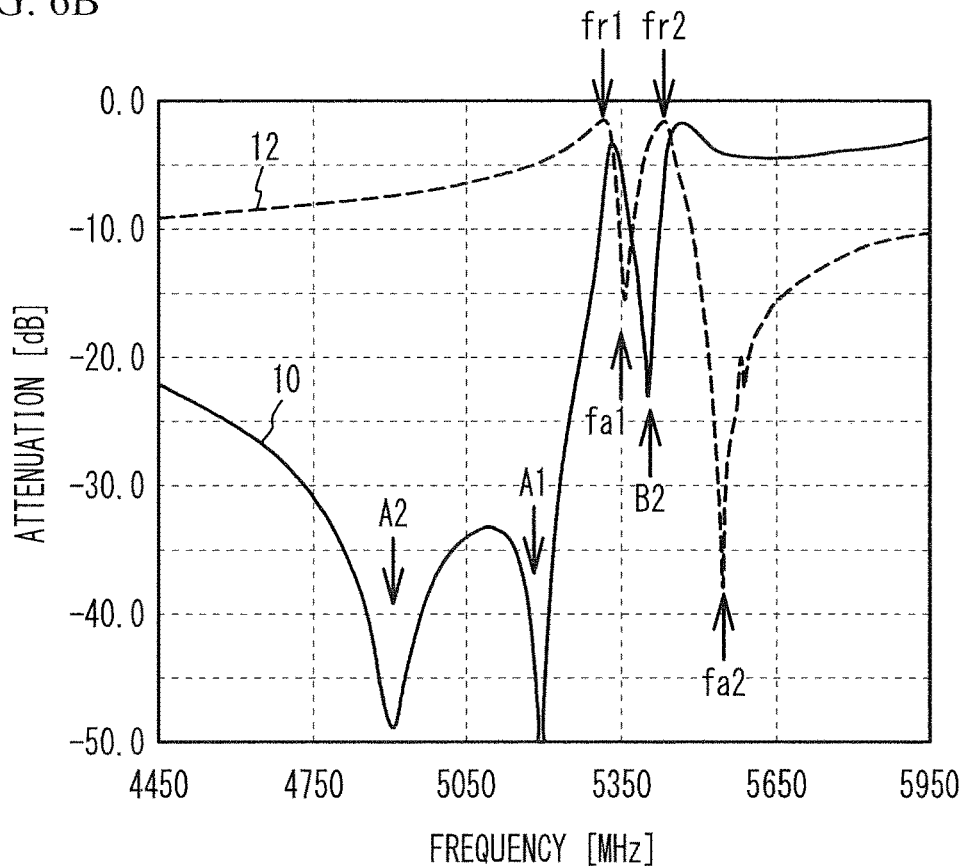
FIG. 6B illustrates the transmission characteristics of the high-pass filter of the third comparative example.

FIG. 6B illustrates the transmission characteristics of the high-pass filter in accordance with the third comparative example. The passbands of the HPF 10 and the acoustic wave resonator circuit 12 are illustrated. As illustrated in FIG. 6B, spurious B2 is formed within the passband. It is considered that the spurious B2 is due to the resonant frequencies fr1 and fr2. The attenuation poles A1 (5196 MHz) and A2 (4908 MHz) are formed at frequencies lower than the passband.

The frequency at which the attenuation of the HPF 10 is −10 dB is 5308 MHz, the frequency at which the attenuation of the HPF 10 is −30 dB is 5235 MHz, and the difference between them is approximately 73 MHz. In the third comparative example, the transition width is narrower than that in the first comparative example, but the spurious B2 is formed within the passband.

As described above, the first through third comparative examples cannot achieve both the narrow transition width and inhibition of formation of spurious within the passband. In particular, it is desired to narrow the transition width of a filter in the band from 3 GHz to 6 GHz such as Band46 (5150 MHz to 5925 MHz) specified in the evolved universal terrestrial radio access (E-UTRA), N77 (3300 MHz to 4200 MHz) and N79 (4400 MHz to 5000 MHz) specified in 5G new radio (NR), which are frequency bands higher in frequency than a typical cellular band. Hereinafter, embodiments that narrow the transition width and inhibit formation of spurious within the passband will be described.

First Embodiment

Figure 7A:
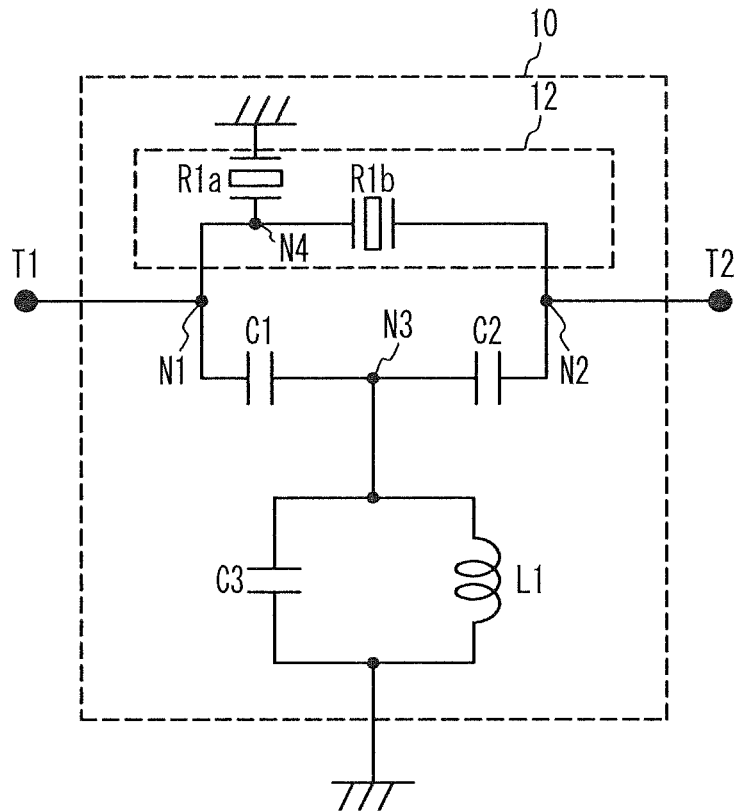
FIG. 7A is a circuit diagram of a high-pass filter in accordance with a first embodiment.

FIG. 7A is a circuit diagram of a high-pass filter in accordance with a first embodiment. As illustrated in FIG. 7A, in the first embodiment, the acoustic wave resonator R1b is connected in parallel to the capacitors C1 and C2 between the nodes N1 and N2. The node N1 is the terminal T1-side node of the capacitor C1, and the node N2 is the terminal T2-side node of the capacitor C2. A first end of the acoustic wave resonator R1a is coupled to a node N4, and a second end of the acoustic wave resonator R1a is coupled to a ground. The node N4 is a node between the acoustic wave resonator R1b and the node N1. The acoustic wave resonator circuit 12 includes the acoustic wave resonators R1a and R1b. Other structures are the same as those of the first comparative example, and the description thereof is thus omitted.

The transmission characteristic between the terminals T1 and T2 of the HPF 10 of the first embodiment was simulated. The simulation conditions are as follows.

Characteristics of the acoustic wave resonator R1a
Resonant frequency fr1: 5364 MHz
Antiresonant frequency fa1: 5440 MHz
Characteristics of the acoustic wave resonator R1b
Resonant frequency fr2: 5440 MHz
Antiresonant frequency fa2: 5590 MHz Other simulation conditions are the same as those of the first comparative example.

Figure 7B:
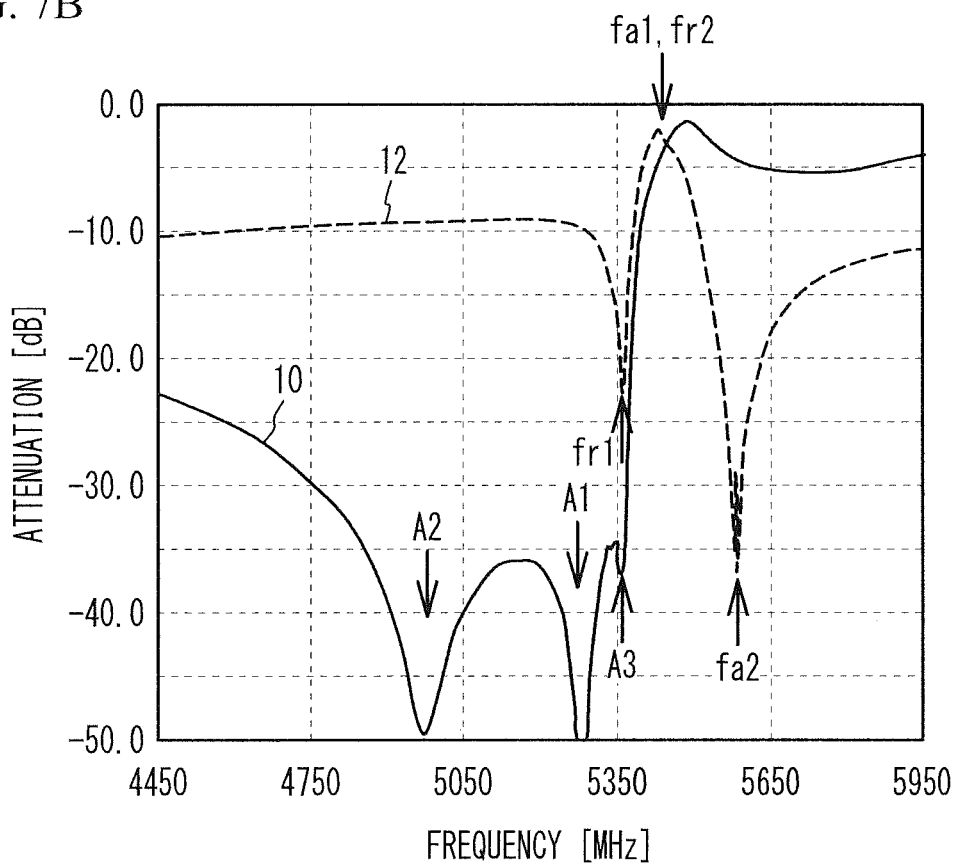
FIG. 7B illustrates the transmission characteristics of the high-pass filter of the first embodiment.

FIG. 7B illustrates the transmission characteristics of the high-pass filter in accordance with the first embodiment. The passbands of the HPF 10 and the acoustic wave resonator circuit 12 are illustrated. As illustrated in FIG. 7B, the resonant frequency fr1 of the acoustic wave resonator R1a is made lower than the antiresonant frequency fa2 of the acoustic wave resonator R1b. The antiresonant frequency fa1 of the acoustic wave resonator R1a and the resonant frequency fr2 of the acoustic wave resonator R1b are made substantially the same. This configuration causes the acoustic wave resonator circuit 12 to have the transmission characteristic of a bandpass filter (BPF).

The attenuation poles A1 (5287 MHz) and A2 (4978 MHz) are formed at frequencies lower than the passband of the HPF 10. Furthermore, an attenuation pole A3 (5364 MHz) is formed between the attenuation pole A1 and the passband of the HPF 10. The frequency of the attenuation pole A3 is identical to the resonant frequency fr1 of the acoustic wave resonator R1a. Thus, it is considered that the attenuation pole A3 is an attenuation pole due to the resonant frequency fr1. No spurious due to the antiresonant frequency fa2 of the acoustic wave resonator R1b is formed within the passband of the HPF 10.

The frequency at which the attenuation of the HPF 10 is −10 dB is 5400 MHz, the frequency at which the attenuation of the HPF 10 is −30 dB is 5375 MHz, and the difference between them is approximately 25 MHz. In the first embodiment, the transition width is significantly narrower than those in the first through third comparative examples, and formation of spurious within the passband is inhibited.

The reason why the transition width is narrowed in the first embodiment is considered because the attenuation pole A3 is formed. The reason why formation of spurious within the passband is inhibited is considered because acoustic wave resonators having different resonant frequencies and different antiresonant frequencies are not connected between the nodes N1 and N2 unlike the first comparative example. That is, it is considered because the acoustic wave resonator R1b is not formed of two acoustic wave resonators having different resonant frequencies and different antiresonant frequencies unlike the second and third comparative examples.

First Variation of the First Embodiment

Figure 8:
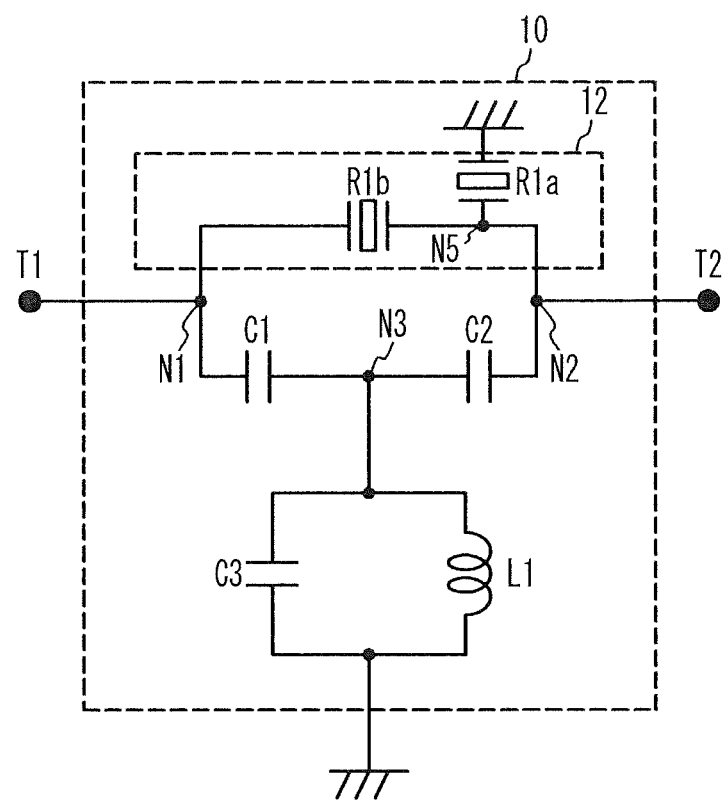
FIG. 8 is a circuit diagram of a high-pass filter in accordance with a first variation of the first embodiment.

FIG. 8 is a circuit diagram of a high-pass filter in accordance with a first variation of the first embodiment. As illustrated in FIG. 8, in the first variation of the first embodiment, a first end of the acoustic wave resonator R1a is coupled to a node N5, and a second end of the acoustic wave resonator R1a is coupled to a ground. The node N5 is a node between the acoustic wave resonator R1b and the node N2. Other structures are the same as those of the first embodiment, and the description thereof is thus omitted. The acoustic wave resonator R1b may be coupled to the node N4, or may be coupled to the node N5, as in the first variation of the first embodiment.

Second Embodiment

Figure 9A:
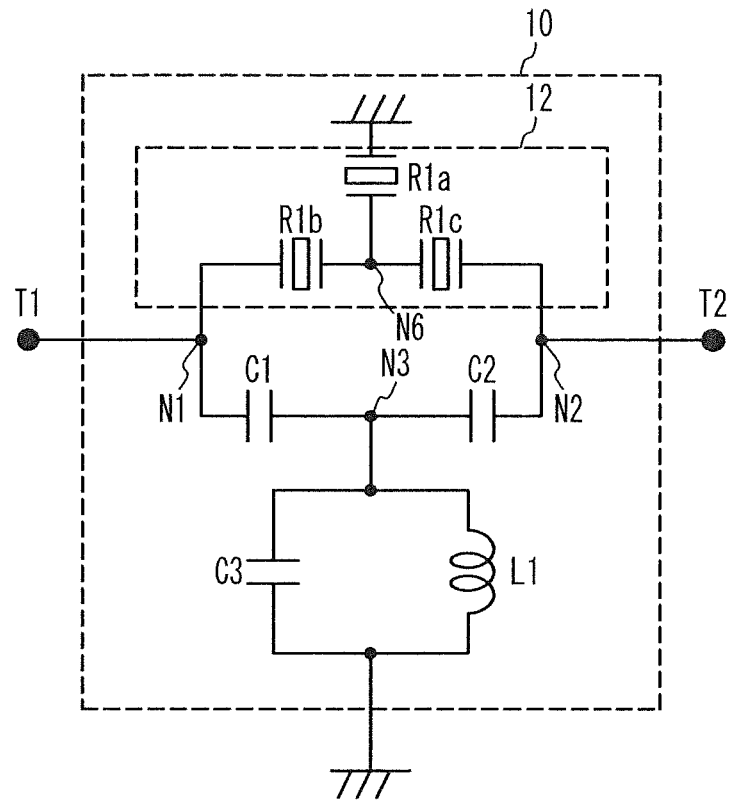
FIG. 9A is a circuit diagram of a high-pass filter in accordance with a second embodiment.

FIG. 9A is a circuit diagram of a high-pass filter in accordance with a second embodiment. As illustrated in FIG. 9A, in the second embodiment, acoustic wave resonators R1b and R1c are connected in series with each other between the nodes N1 and N2 and is connected in parallel to the capacitors C1 and C2 between the nodes N1 and N2. A first end of the acoustic wave resonator R1a is coupled to a node N6, and a second end of the acoustic wave resonator R1a is coupled to a ground. The node N6 is a node between the acoustic wave resonators R1b and R1c. The acoustic wave resonator circuit 12 includes the acoustic wave resonators R1a through R1c. Other structures are the same as those of the first embodiment, and the description thereof is thus omitted.

The transmission characteristic between the terminals T1 and T2 of the HPF 10 of the second embodiment was simulated. The simulation conditions are as follows.
Capacitances of the capacitors C1 through C3
C1: 0.205 pF
C2: 0.19 pF
C3: 0.19 pF
Characteristics of the acoustic wave resonator R1a
Resonant frequency fr1: 5364 MHz
Antiresonant frequency fa1: 5440 MHz
Characteristics of the acoustic wave resonator R1b
Resonant frequency fr2: 5440 MHz
Antiresonant frequency fa2: 5590 MHz
Characteristics of the acoustic wave resonator R1c
Resonant frequency fr3: 5440 MHz
Antiresonant frequency fa3: 5590 MHz
Other simulation conditions are the same as those of the first embodiment.

Figure 9B:
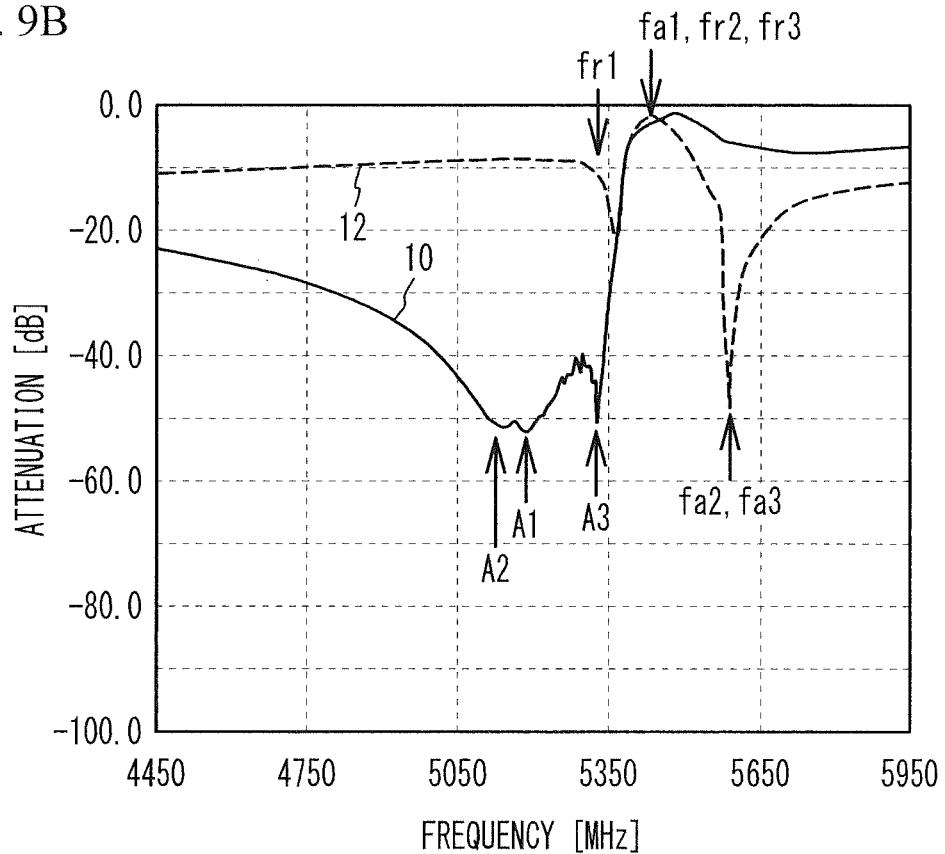
FIG. 9B illustrates the transmission characteristics of the high-pass filter in accordance with the second embodiment.

FIG. 9B illustrates the transmission characteristics of the high-pass filter in accordance with the second embodiment. The passbands of the HPF 10 and the acoustic wave resonator circuit 12 are illustrated. As illustrated in FIG. 9B, the acoustic wave resonator circuit 12 has the transmission characteristic of a BPF.

The attenuation poles A1 (5195 MHz), A2 (5140 MHz), and A3 (5330 MHz) are formed at frequencies lower than the passband of the HPF 10. The frequency of the attenuation pole A3 is approximately equal to the resonant frequency fr1 of the acoustic wave resonator R1a. No spurious due to the antiresonant frequencies fa2 and fa3 of the acoustic wave resonators R1b and R1c is formed within the passband of the HPF 10.

The frequency at which the attenuation of the HPF 10 is −10 dB is 5386 MHz, the frequency at which the attenuation of the HPF 10 is −30 dB is 5356 MHz, and the difference between them is approximately 30 MHz. In the second embodiment, as in the first embodiment, the transition width is narrowed, and formation of spurious within the passband is inhibited.

As described in the second embodiment, the number of the acoustic wave resonators R1b and R1c connected in series between the nodes N1 and N2 may be two or more. The resonant frequencies fr2 and fr3 of the acoustic wave resonators R1b and R1c are preferably substantially the same to the extent that no spurious is formed within the passband, and the antiresonant frequencies fa2 and fa3 are preferably substantially the same to the extent that no spurious is formed within the passband.

Third Embodiment

Figure 10A:
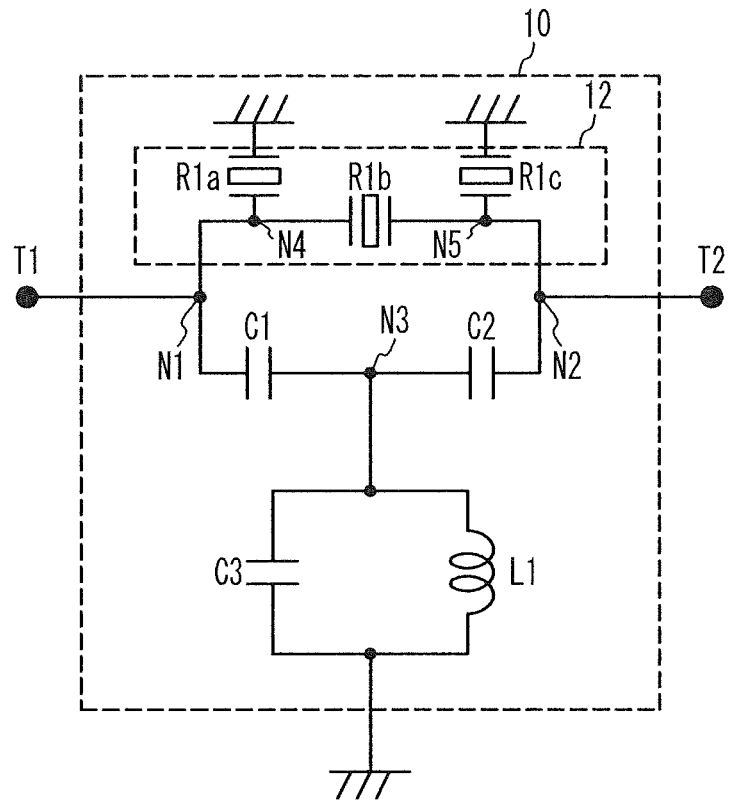
FIG. 10A is a circuit diagram of a high-pass filter in accordance with a third embodiment.

FIG. 10A is a circuit diagram of a high-pass filter in accordance with a third embodiment. As illustrated in FIG. 10A, in the third embodiment, the acoustic wave resonator R1b is connected in parallel to the capacitors C1 and C2 between the nodes N1 and N2. A first end of the acoustic wave resonator R1a is coupled to the node N4, and a second end of the acoustic wave resonator R1a is coupled to a ground. A first end of the acoustic wave resonator R1c is coupled to the node N5, and a second end of the acoustic wave resonator R1c is coupled to a ground. The acoustic wave resonator circuit 12 includes the acoustic wave resonators R1a through R1c. Other structures are the same as those of the first embodiment, and the description thereof is thus omitted.

The transmission characteristic between the terminals T1 and T2 of the HPF 10 of the third embodiment was simulated. The simulation conditions are as follows.
Characteristics of the acoustic wave resonator R1a
Resonant frequency fr1: 5364 MHz
Antiresonant frequency fa1: 5440 MHz
Characteristics of the acoustic wave resonator R1b
Resonant frequency fr2: 5440 MHz
Antiresonant frequency fa2: 5590 MHz
Characteristics of the acoustic wave resonator R1c
Resonant frequency fr3: 5364 MHz
Antiresonant frequency fa3: 5440 MHz
Other simulation conditions are the same as those of the first embodiment.

Figure 10B:
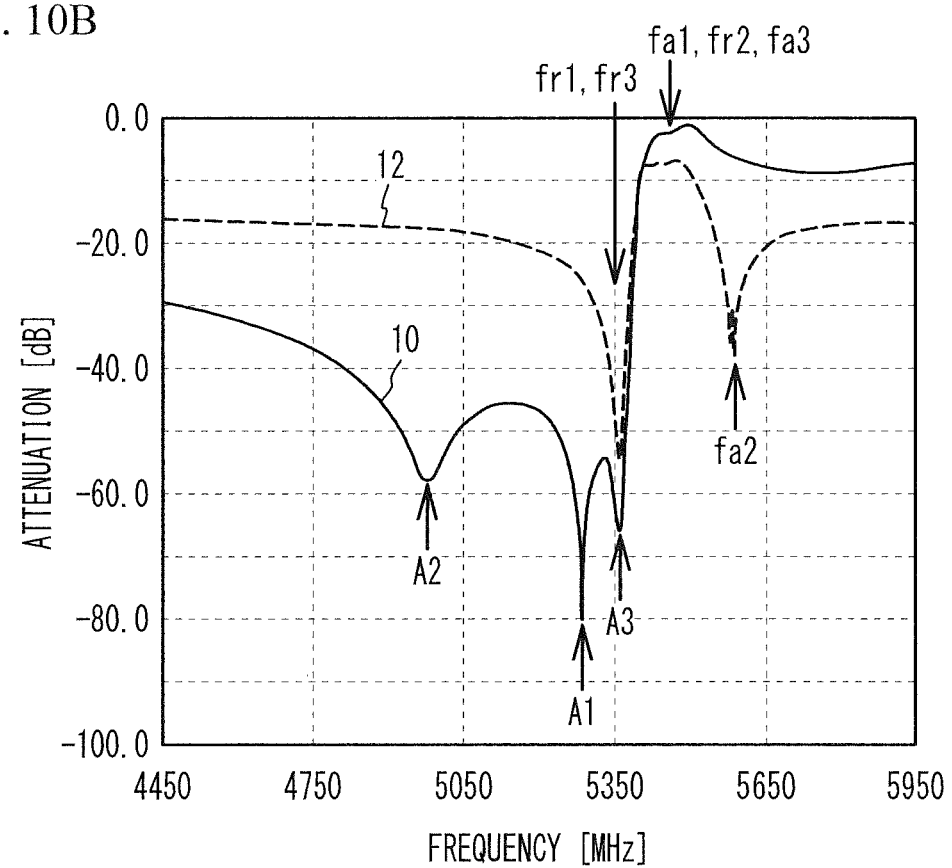
FIG. 10B illustrates the transmission characteristics of the high-pass filter in accordance with the third embodiment.

FIG. 10B illustrates the transmission characteristics of the high-pass filter of the third embodiment. The passbands of the HPF 10 and the acoustic wave resonator circuit 12 are illustrated. As illustrated in FIG. 10B, the acoustic wave resonator circuit 12 has the transmission characteristic of a BPF.

The attenuation poles A1 (5287 MHz), A2 (4978 MHz), and A3 (5362 MHz) are formed at frequencies lower than the passband of the HPF 10. The frequency of the attenuation pole A3 is substantially identical to the resonant frequencies fr1 and fr3 of the acoustic wave resonators R1a and R1c. No spurious due to the antiresonant frequency fa2 of the acoustic wave resonator R1b is formed within the passband of the HPF 10.

The frequency at which the attenuation of the HPF 10 is −10 dB is 5405 MHz, the frequency at which the attenuation of the HPF 10 is −30 dB is 5386 MHz, and the difference between them is approximately 19 MHz. In the third embodiment, as in the first embodiment, the transition width is narrowed, and formation of spurious within the passband is inhibited.

As described in the third embodiment, the number of the acoustic wave resonators R1a and R1c shunt-connected between the nodes N1 and N2 may be two or more. The resonant frequencies fr1 and fr3 of the acoustic wave resonators R1a and R1c are preferably substantially the same to the extent that no spurious is formed within the passband, and the antiresonant frequencies fa1 and fa3 are preferably substantially the same to the extent that no spurious is formed within the passband.

The first through third embodiments have described a T-type C-L-C HPF as an example, but the HPF may be a Tr-type L-C-L HPF. It is sufficient if at least one capacitor is connected in series between the terminals T1 and T2. It is sufficient if at least one inductor is connected in parallel to the pathway between the terminals T1 and T2. The capacitor C3 is not necessarily connected.

In the first through third embodiments, one or more capacitors C1 and C2 are connected in series with a first pathway between the terminal T1 (an input terminal) and the terminal T2 (an output terminal). That is, both terminals of one or more capacitors C1 and C2 are coupled to the first pathway. A first end of at least one inductor L1 is coupled to the first pathway, and a second end of at least one inductor L1 is coupled to a ground. At least one acoustic wave resonator R1b (a first acoustic wave resonator) is connected in series with a second pathway connected in parallel to the first pathway between the terminals T1 and T2. That is, both terminals of at least one acoustic wave resonator R1b are coupled to the second pathway. A first end of at least one acoustic wave resonator R1a (a second acoustic wave resonator) is coupled to the second pathway, and a second end of at least one acoustic wave resonator R1a is coupled to a ground. This configuration narrows the transition width compared with the configurations of the first through third comparative examples, as in the first through third embodiments. That is, the steepness of the attenuation in the transition region between the passband and the suppression band of the high-pass filter is improved. Furthermore, formation of spurious within the passband described in the second and third comparative examples is inhibited.

The resonant frequency fr1 of the acoustic wave resonator R1a is lower than the passband of the HPF 10. Thus, the transition width of the HPF 10 is narrowed.

The antiresonant frequency fa2 of the acoustic wave resonator R1b is located within the passband of the HPF 10. Thus, the transition width of the HPF 10 is narrowed.

The antiresonant frequency fa1 of the acoustic wave resonator R1a and the resonant frequency fr2 of the acoustic wave resonator R1b are located within the passband of the HPF 10. Thus, the antiresonant frequency fa1 and the resonant frequency fr2 form the passband, and fa1 and the difference between fr2 and fr1 form the transition width. Therefore, the transition width of the HPF 10 is narrowed.

The resonant frequency fr1 of the acoustic wave resonator R1a is higher than the highest frequency among frequencies of one or more attenuation poles A1 and A2 formed by the capacitors C1 through C3, the inductor L1, and the acoustic wave resonator R1b. Thus, the attenuation range can be formed by the attenuation pole A1 and the attenuation pole A3 due to the resonant frequency fr1.

In the first embodiment, at least one first acoustic wave resonator is a single acoustic wave resonator R1b, and at least one second acoustic wave resonator is a single acoustic wave resonator R1a. Thus, each of the resonant frequency fr2 and the antiresonant frequency fa2 of the at least one first acoustic wave resonator has a single value, and each of the resonant frequency fr1 and the antiresonant frequency fa1 of the at least one second acoustic wave resonator has a single value. Therefore, formation of spurious in the passband of the HPF 10 described in the second and third comparative examples is inhibited.

In the second embodiment, the second acoustic wave resonators R1b and R1c have substantially the same resonant frequency and substantially the same antiresonant frequency. Thus, formation of spurious within the passband of the HPF 10 due to the difference in resonant frequency and/or antiresonant frequency described in the second and third comparative examples is inhibited.

In the third embodiment, the first acoustic wave resonators R1a and R1c have substantially the same resonant frequency and substantially the same antiresonant frequency. Thus, formation of spurious within the passband of the HPF 10 due to the difference in resonant frequency and/or antiresonant frequency described in the second and third comparative examples is inhibited.

Fourth Embodiment

Figure 11:
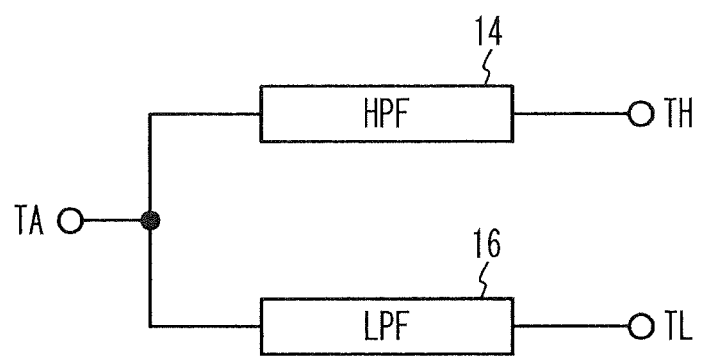
FIG. 11 is a circuit diagram of a diplexer in accordance with a fourth embodiment.

FIG. 11 is a circuit diagram of a diplexer in accordance with a fourth embodiment. As illustrated in FIG. 11, an HPF 14 is connected between a common terminal TA and a terminal TH. The HPF 14 is the HPF 10 of any one of the first through third embodiments. A low-pass filter (LPF) 16 is connected between the common terminal TA and a terminal TL. The HPF 14 transmits signals in the passband to the terminal TH or the common terminal TA among high-frequency signals input from the common terminal TA or the terminal TH, and suppresses signals with other frequencies. The LPF 16 transmits signals in the passband to the terminal TL or the common terminal TA among signals input from the common terminal TA or the terminal TL, and suppresses signals with other frequencies. Instead of the LPF 16, a BPF may be connected.

A diplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:
1. A high-pass filter comprising:
   at least one capacitor located in a first pathway between an input terminal and an output terminal, the at least one capacitor being connected between the input terminal and the output terminal;

at least one inductor, a first end of the at least one inductor being coupled to the first pathway, a second end of the at least one inductor being coupled to a ground;

at least one first acoustic wave resonator located in a second pathway connected in parallel to the first pathway between the input terminal and the output terminal, the at least one first acoustic wave resonator being connected in parallel to the at least one capacitor; and at least one second acoustic wave resonator, a first end of the at least one second acoustic wave resonator being coupled to the second pathway, a second end of the at least one second acoustic wave resonator being coupled to a ground, wherein no acoustic wave resonator is connected in series to the at least one inductor between the first pathway and the ground, and no inductor is connected in series to the at least one second acoustic wave resonator between the second pathway and the ground.

2. The high-pass filter according to claim 1, wherein a resonant frequency of the at least one second acoustic wave resonator is lower than a passband of the high-pass filter.

3. The high-pass filter according to claim 2, wherein an antiresonant frequency of the at least one first acoustic wave resonator is located within the passband.

4. The high-pass filter according to claim 2, wherein an antiresonant frequency of the at least one second acoustic wave resonator and a resonant frequency of the at least one first acoustic wave resonator are located within the passband.

5. The high-pass filter according to claim 1, wherein the at least one first acoustic wave resonator and the at least one second acoustic wave resonator are piezoelectric thin film resonators or surface acoustic wave resonators.

6. A multiplexer comprising:
the high-pass filter according to claim 1.

7. A high-pass filter comprising:
at least one capacitor located in a first pathway between an input terminal and an output terminal, the at least one capacitor being connected between the input terminal and the output terminal;

at least one inductor, a first end of the at least one inductor being coupled to the first pathway, a second end of the at least one inductor being coupled to a ground;

at least one first acoustic wave resonator located in a second pathway connected in parallel to the first pathway between the input terminal and the output terminal, the at least one first acoustic wave resonator being connected in parallel to the at least one capacitor; and at least one second acoustic wave resonator, a first end of the at least one second acoustic wave resonator being coupled to the second pathway, a second end of the at least one second acoustic wave resonator being coupled to a ground, wherein a resonant frequency of the at least one second acoustic wave resonator is lower than a passband of the high-pass filter, an antiresonant frequency of the at least one second acoustic wave resonator and a resonant frequency of the at least one first acoustic wave resonator are located within the passband, and the resonant frequency of the at least one second acoustic wave resonator is higher than the highest frequency among frequencies of one or more attenuation poles formed by the at least one capacitor, the at least one inductor, and the at least one first acoustic wave resonator.

8. The high-pass filter according to claim 7, wherein the at least one first acoustic wave resonator is a single first acoustic wave resonator, and
the at least one second acoustic wave resonator is a single second acoustic wave resonator.

9. The high-pass filter according to claim 7, wherein the at least one second acoustic wave resonator includes a plurality of second acoustic wave resonators, and
the second acoustic wave resonators have resonant frequencies substantially equal to each other, and have antiresonant frequencies substantially equal to each other.

10. The high-pass filter according to claim 7, wherein the at least one first acoustic wave resonator includes a plurality of first acoustic wave resonators, and
the first acoustic wave resonators have resonant frequencies substantially equal to each other, and have antiresonant frequencies substantially equal to each other.

11. A high-pass filter comprising:
at least one capacitor located in a first pathway between an input terminal and an output terminal, the at least one capacitor being connected between the input terminal and the output terminal;

at least one inductor, a first end of the at least one inductor being coupled to the first pathway, a second end of the at least one inductor being coupled to a ground;

at least one first acoustic wave resonator located in a second pathway connected in parallel to the first pathway between the input terminal and the output terminal, the at least one first acoustic wave resonator being connected in parallel to the at least one capacitor; and at least one second acoustic wave resonator, a first end of the at least one second acoustic wave resonator being coupled to the second pathway, a second end of the at least one second acoustic wave resonator being coupled to a ground, wherein a resonant frequency of the at least one second acoustic wave resonator is lower than a passband of the high-pass filter, an antiresonant frequency of the at least one first acoustic wave resonator is located within the passband, and an antiresonant frequency of the at least one second acoustic wave resonator and a resonant frequency of the at least one first acoustic wave resonator are located within the passband.

* * * * *